United States Patent
Park et al.

(10) Patent No.: US 7,012,001 B2
(45) Date of Patent: Mar. 14, 2006

(54) METHOD FOR MANUFACTURING A SEMICONDUCTOR DEVICE FOR USE IN A MEMORY CELL THAT INCLUDES FORMING A COMPOSITE LAYER OF TANTALUM OXIDE AND TITANIUM OXIDE OVER A BOTTOM CAPACITOR ELECTRODE

(75) Inventors: Ki-Seon Park, Ichon-shi (KR); Byoung-Kwan Ahn, Ichon-shi (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 132 days.

(21) Appl. No.: 10/728,855

(22) Filed: Dec. 8, 2003

(65) Prior Publication Data

US 2004/0082126 A1    Apr. 29, 2004

Related U.S. Application Data

(62) Division of application No. 09/739,740, filed on Dec. 20, 2000, now Pat. No. 6,690,052.

(30) Foreign Application Priority Data

Dec. 22, 1999    (KR) ............................... 1999-60536

(51) Int. Cl.
*H01L 21/8242*    (2006.01)
(52) U.S. Cl. ...................... 438/240; 438/253; 438/396; 438/785
(58) Field of Classification Search ................ 438/240, 438/253, 396, 685, 686, 785
See application file for complete search history.

(56) References Cited

U.S. PATENT DOCUMENTS

| 4,734,340 | A | * | 3/1988 | Saito et al. ................... 428/701 |
| 5,561,307 | A |   | 10/1996 | Mihara et al. |
| 5,621,606 | A |   | 4/1997 | Hwang |
| 5,841,186 | A | * | 11/1998 | Sun et al. ................... 257/635 |
| 5,847,424 | A |   | 12/1998 | Kang |
| 5,923,524 | A |   | 7/1999 | Cava |
| 5,926,710 | A |   | 7/1999 | Tseng |
| 6,046,081 | A | * | 4/2000 | Kuo ............................ 438/240 |
| 6,144,060 | A |   | 11/2000 | Park et al. |
| 6,235,594 | B1 | * | 5/2001 | Merchant et al. ........... 438/287 |
| 6,248,640 | B1 | * | 6/2001 | Nam ........................... 438/396 |
| 6,339,009 | B1 | * | 1/2002 | Lee et al. .................... 438/396 |
| 6,433,380 | B1 | * | 8/2002 | Shin ............................. 257/310 |

FOREIGN PATENT DOCUMENTS

JP    2000-258777    9/2000

* cited by examiner

*Primary Examiner*—Stephen W. Smoot
(74) *Attorney, Agent, or Firm*—Finnegan, Henderson, Farabow, Garrett & Dunner, L.L.P.

(57) ABSTRACT

A semiconductor device for use in a memory cell includes an active matrix provided with a semiconductor substrate, a plurality of transistors formed on the semiconductor substrate and conductive plugs electrically connected to the transistors, a number of bottom electrodes formed on top of the conductive plugs, composite films formed on the bottom electrodes and $Al_2O_3$ films formed on the composite films. In the device, the composite films are made of $(Ta_2O_5)_{0.92}(TiO_2)_{0.08}$ by using an atomic layer deposition (ALD).

17 Claims, 5 Drawing Sheets

US 7,012,001 B2

METHOD FOR MANUFACTURING A SEMICONDUCTOR DEVICE FOR USE IN A MEMORY CELL THAT INCLUDES FORMING A COMPOSITE LAYER OF TANTALUM OXIDE AND TITANIUM OXIDE OVER A BOTTOM CAPACITOR ELECTRODE

This is a divisional of application Ser. No. 09/739,740, filed Dec. 20, 2000 now U.S. Pat. No. 6,690,052 which claims priority to Korean Patent Application No. 1999-60526, filed Dec. 22, 1999, the entire contents of which are incorporated herein by reference.

FIELD OF THE INVENTION

The present invention relates to a semiconductor device; and, more particularly, to a semiconductor memory device incorporating therein high K dielectric as a capacitor dielectric film.

DESCRIPTION OF THE PRIOR ART

As is well known, a dynamic random access memory (DRAM) with at least one memory cell comprised of a transistor and a capacitor has a higher degree of integration mainly by down-sizing through micronization. However, there is still a demand for downsizing the area of the memory cell.

To meet the demand, there have been proposed several structures for the capacitor, such as a trench type or a stack type capacitor, which are arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, there have been introduced a high K dielectric, e.g., $Ta_2O_5$ or the like, as a capacitor thin film in place of conventional silicon oxide film or silicon nitride film. Since, however, a $Ta_2O_5$ layer is grown with a columnar structure during a following heat-treatment process, the grown $Ta_2O_5$ layer becomes a high leakage current. Therefore, it is very difficult for applying the $Ta_2O_5$ layer to a capacitor thin film for use in memory device.

Alternatively, a multi-layer dielectric, e.g., $Ta_2O/TiO_2$ or $Ta_2O/Al_2O_3$, has been proposed to use as a capacitor thin film by using a metal organic chemical deposition (MOCVD) to overcome the above-described problem. However, the MOCVD method makes a foreign material reside in the capacitor thin film. This result enforces the capacitor thin film to be performed a high temperature heat-treatment, which, in turn, generates a defect and a high leakage current in the capacitor thin film.

There are still demands for developing a high K dielectric having a low leakage current which is compatible with a semiconductor process.

SUMMARY OF THE INVENTION

It is, therefore, an object of the present invention to provide a semiconductor device incorporating therein a high K dielectric as a capacitor dielectric.

It is another object of the present invention to provide a method for manufacturing a semiconductor device incorporating therein a high K dielectric as a capacitor dielectric.

In accordance with one aspect of the present invention, there is provided a semiconductor device for use in a memory cell, comprising: an active matrix provided with a semiconductor substrate, a plurality of transistors formed on the semiconductor substrate and conductive plugs electrically connected to the transistors; a number of bottom electrodes formed on top of the conductive plugs; composite films formed on the bottom electrodes; and $Al_2O_3$ films formed on the composite films.

In accordance with another aspect of the present invention, there is provided a method for manufacturing a semiconductor device for use in a memory cell, the method comprising the steps of: a) preparing an active matrix provided with at least one transistor, a plurality of conductive plugs electrically connected to the transistors and an insulating layer formed around the conductive plugs; b) forming a conductive layer on top of the active matrix; c) patterning the conductive layer a predetermined configuration, thereby obtaining a number of bottom electrodes; d) forming a $(Ta_2O_5)_x(TiO_2)_y$ composite layer on the bottom electrodes, x and y representing a molar fraction, respectively; e) forming a dielectric layer on the $(Ta_2O_5)_x(TiO_2)_y$ composite layer; and f) patterning the dielectric layer and the $(Ta_2O_5)_x(TiO_2)_y$ composite layer into a preset configuration, thereby obtaining the semiconductor device.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
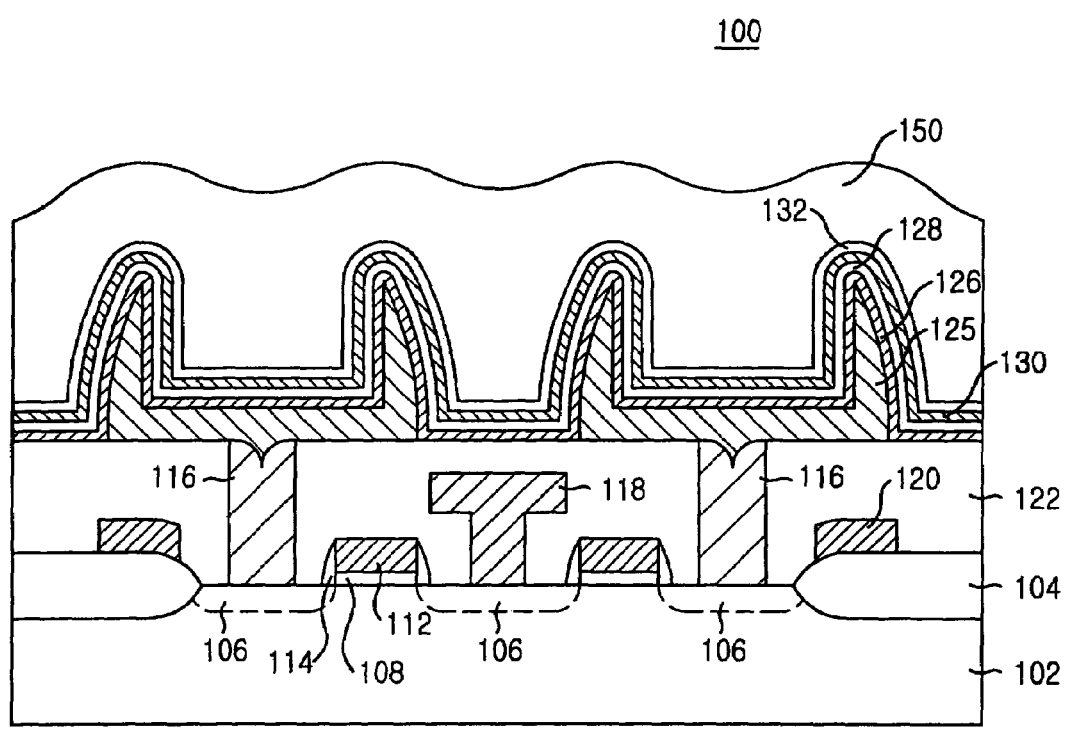
FIG. 1 is a cross sectional view setting forth a semiconductor device in accordance with the present invention.

There are provided in FIGS. 1 and 2A to 2G a cross sectional view of a semiconductor device 100 for use in a memory cell and cross sectional views setting forth a method for the manufacture thereof in accordance with preferred embodiments of the present invention. It should be noted that like parts appearing in FIGS. 1 and 2A to 2G are represented by like reference numerals.

In FIG. 1, there is provided a cross sectional view of the inventive semiconductor device 100 comprising an active matrix and capacitor structures. The active matrix includes a silicon substrate 102, transistors formed on top of the silicon substrate 102, an isolation region 104 for isolating the transistors, poly plugs 116, a bit line 118 and word lines 120. Each of the transistors has diffusion regions 106, a gate oxide 108, a gate line 112 and a sidewall 114.

In the semiconductor device 100, the bit line 118 is electrically connected to one of the diffusion regions 106 to apply an electric potential. Each of the capacitor structures is electrically connected to the other diffusion regions 106 through the poly plugs 116. Although the bit line 118 actually extends in right and left directions bypassing the poly plugs 116, the drawing does not show these parts of the bit line 118. The capacitor structures can be connected to a plate line (not shown) to apply thereto a common constant potential.

Each of the capacitor structures includes a lower electrode 125, a first dielectric layer 126 formed on top of the lower electrode 125, a second dielectric layer 128, a first upper electrode layer 130 and a second upper electrode layer 132 formed on top of the first upper electrode layer 130. The second dielectric layer 128 is disposed between the first dielectric layer 126 and the first upper electrode layer 130. It is preferable that the lower electrodes 125 is made of a material selected from a group consisting of a poly silicon (poly-Si), W, WN, $Wsi_x$, TiN, Pt, Ru, Ir and the like and the second upper electrode layer 132 is made of a material selected from a group consisting of a poly-Si, W, WN, $Wsi_x$ and the like. And also, the first dielectric layer 126 is made of $(Ta_2O_5)_{0.92}(TiO_2)_{0.08}$ by using an atomic layer deposition (ALD). In the preferred embodiment, the second dielectric layer 128 is made of aluminum oxide ($Al_2O_3$) and the first upper electrode layer 130 is made of TiN for improving an adhesion between the second dielectric layer 128 and the second upper electrode layer 132.

FIGS. 2A to 2G are schematic cross sectional views setting forth the method for manufacture of a capacitor structure 140 for use in a semiconductor memory device in accordance with the present invention.

Figure 2A:
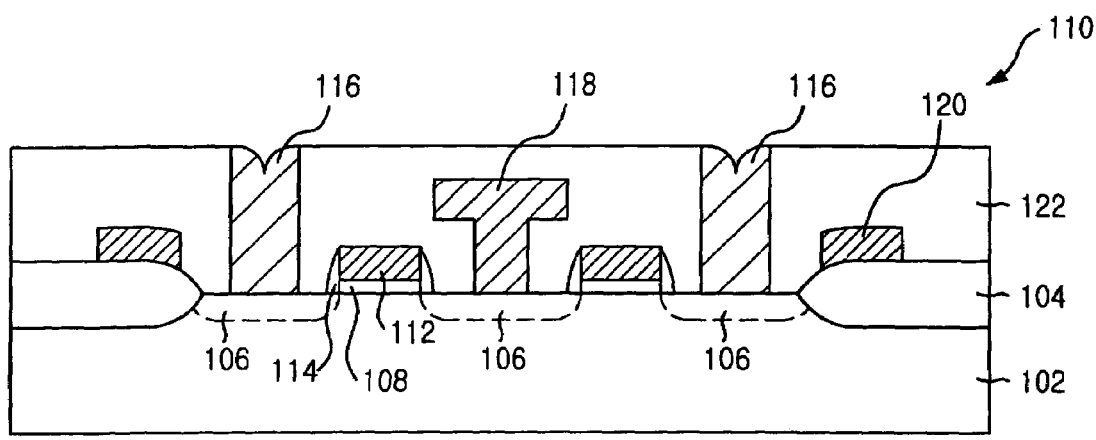
FIGS. 2A, 2B, 2C, 2D, 2E, 2F and 2G are schematic cross sectional views setting forth a method for the manufacture of the semiconductor memory device in accordance with the present invention.

The process for manufacturing the semiconductor device begins with the preparation of an active matrix 110 including a silicon substrate 102, an isolation region 104, diffusion regions 106, gate oxides 108, gate lines 112, a sidewall 114, a bit line 118, poly plugs 116 and an insulating layer 122, as shown in FIG. 2A. The bit line 118 is electrically connected to one of the diffusion regions 106 to apply an electric potential. Each of the poly plugs 116 is electrically connected to the other diffusion regions 106, respectively. Although the bit line 118 actually extends in right and left directions bypassing the poly plugs 116, the drawing does not show these parts of the bit line 118. The capacitor structures 140 can be connected to a plate line (not shown) to apply thereto a common constant potential. The insulating layer 122 is made of a material, e.g., boron-phosphor-silicate glass (BPSG).

Figure 2B:
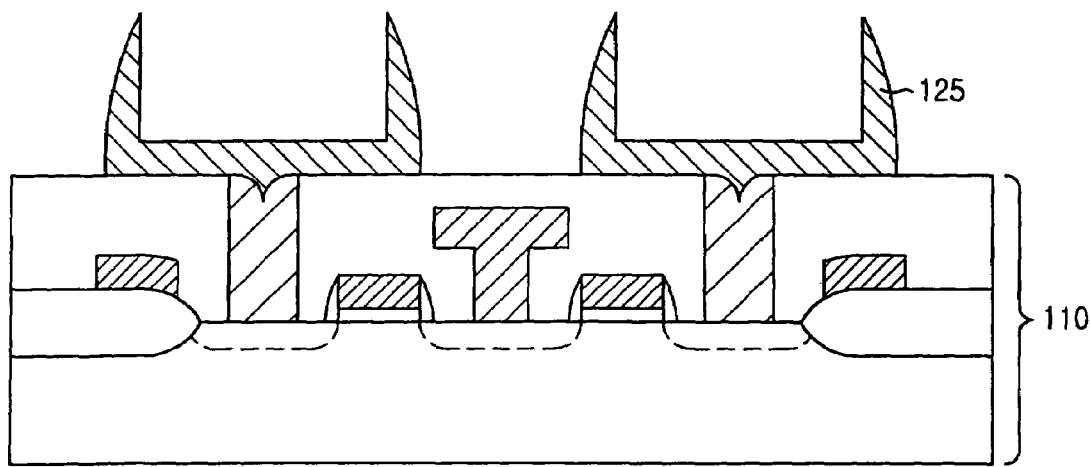

In an ensuing step, lower electrodes 125 are formed on top of the active matrix 110 by using a semiconductor process in such a way that each of the lower electrodes 125 is electrically connected to a corresponding poly plug 116, as shown in FIG. 2B. It is preferable that the lower electrode 125 is made of a material selected from a group consisting of a poly-Si, W, WN, $WSi_x$, TiN, Pt, Ru, Ir and the like.

Thereafter, a first dielectric layer 126 is formed on the lower electrodes 125 and the active matrix 110 by using an atomic layer deposition (ALD). Preferably, the first dielectric layer 126 is made of $(Ta_2O_5)_x(TiO_2)_y$, wherein x and y represents a molar fraction, respectively. In the preferred embodiment, x equals to 0.92 and y equals to 0.02. The first dielectric layer 126 of $(Ta_2O_5)_{0.92}(TiO_2)_{0.08}$ can be formed by as follows: a) maintaining a reaction chamber at a temperature ranging from approximately 250° C. to approximately 300° C.; b) alternatively introducing a first and a second source gases into a reaction chamber to form a $Ta_2O_5$ thin layer; c) alternately introducing a third and a fourth source gasses into the reaction chamber to form a $TiO_2$ thin layer on top of the $Ta_2O_5$ thin layer; d) repeating the step b) and c) to form a stacked layer of $Ta_2O_5$ and $TiO_2$; and e) heating the stacked layer at a temperature ranging from approximately 400° C. to approximately 550° C., thereby obtaining the $(Ta_2O_5)_x(TiO_2)_y$ dielectric layer.

In the embodiment, if a pentaethoxytantalum ((Ta$(C_2H_5O)_5$) gas used as the first source gas, the second source gas can be a gas selected from a group consisting of a $H_2O$ gas, an $O_2$ gas, a $N_2O$ gas, an alcohols ($C_xH_yOH$) gas or the like. On the other hand, a tantalum chloride $TaCl_5$ is used as a first source gas, a second source gas can be a gas selected from a group consisting of a $H_2O$ gas, an $O_2$ gas, a $N_2O$ gas, a $C_xH_yOH$ gas or the like. During the step b), it is preferable that the $Ta_2O_5$ thin layer is formed to a thickness which is less than or equal 10 Å. $TiCl_4$ is used as the third source gas and the fourth source is a gas selected from a group consisting of a $H_2O$ gas, an $O_2$ gas, a $N_2O$ gas or the like. During the step c), it is preferable that the $TiO_2$ thin layer is formed to a thickness which is less than or equal 5 Å. It should be noted that the step e) can be performed after the formation of upper electrodes.

It is preferable that the stacked $(Ta_2O_5)_x(TiO_2)_y$ layer has a thickness ranging from approximately 100 Å to approximately 200 Å. It should be noted that cycles of step b) and step c) are controlled in such a way that x equal to 0.92 and y equal to 0.08. After the step b), the preferred embodiment of the present invention can include the step of introducing a first inert gas into the reaction chamber for 0.1–10 seconds to remove the first and the second source gases which are remained in the reaction chamber. And also, after the step c), the formation of the first dielectric layer 126 further includes the step of introducing a second inert gas into the reaction chamber for 0.1–10 seconds to remove the source gases and the first inert gas are remained in the reaction chamber.

Figure 2C:
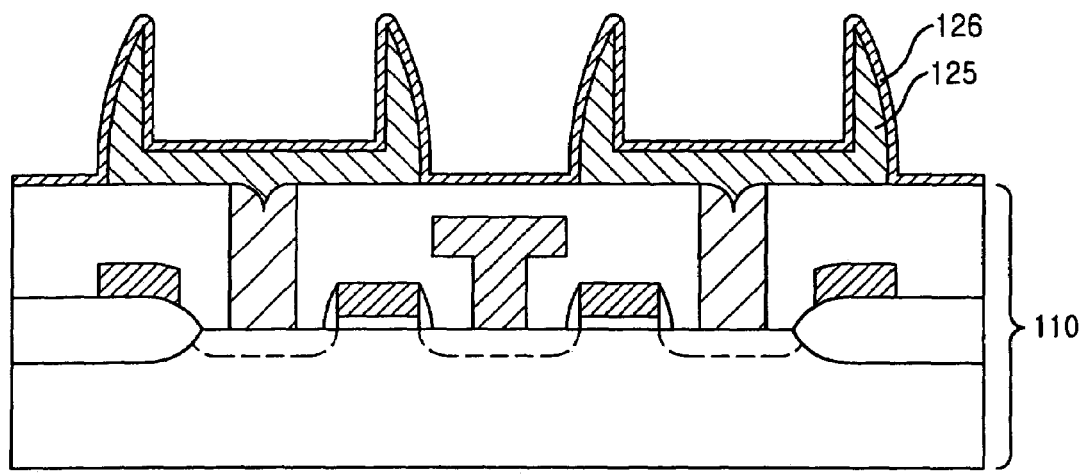

And, the stacked layer is patterned into a predetermined configuration, as shown in FIG. 2C.

Figure 2D:
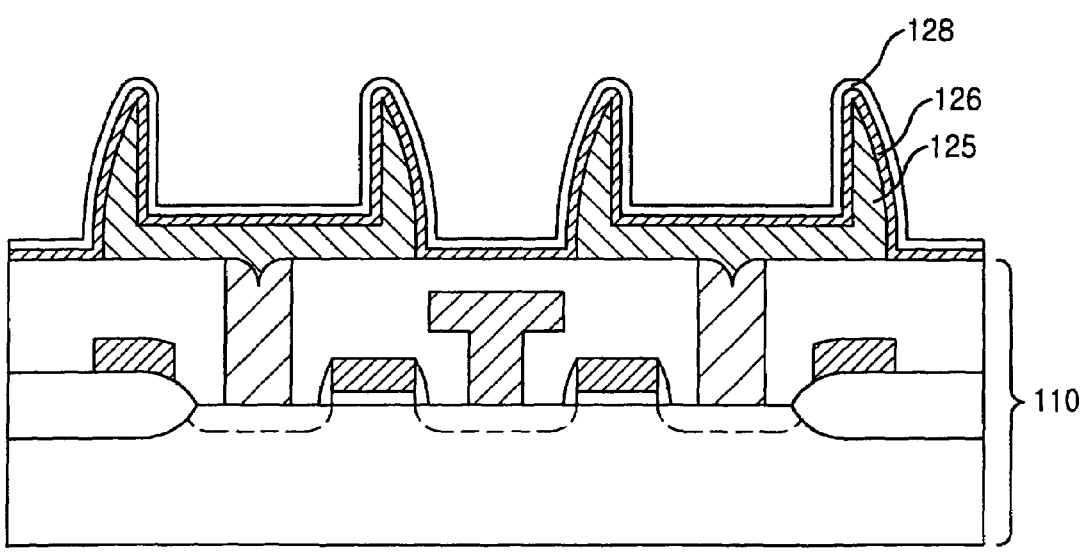

In a following step, a second dielectric layer 128 is formed on the first dielectric layer 126, as shown in FIG. 2D. In the preferred embodiment, the second dielectric layer 128 is made of a high K dielectric material such as $Al_2O_3$ by using ALD.

Figure 2E:
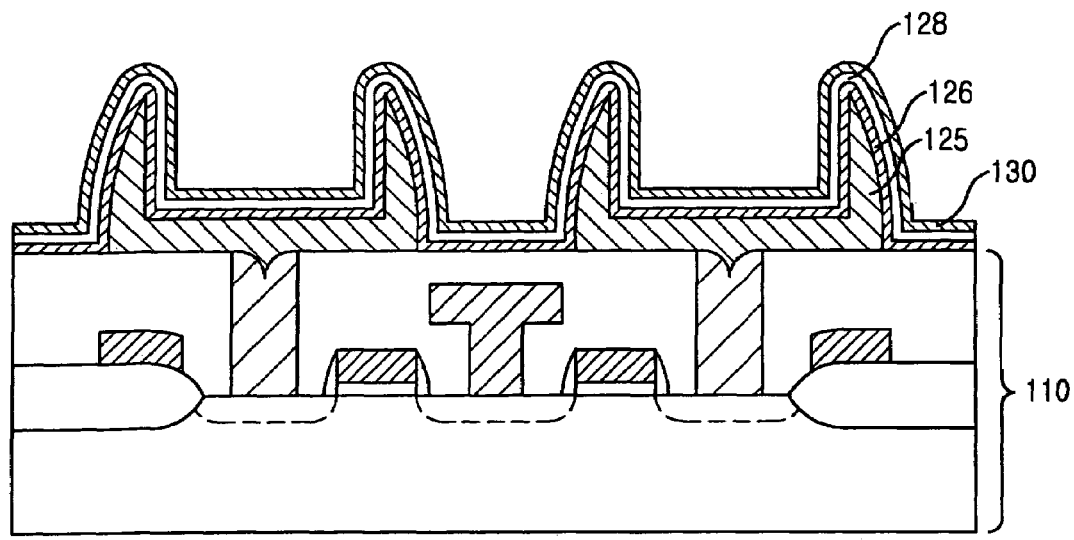

Referring to FIG. 2E, a first upper electrode layer 130, e.g., made of TiN, is formed on top of the second dielectric layer 128 by using an ALD method for improving an adhesion between the second dielectric layer 128 and a second upper electrode layer 132 to be formed thereon. In the preferred embodiment, the ALD method utilizes $TiCl_4$ and $NH_4$ as a reactive source gas.

Figure 2F:
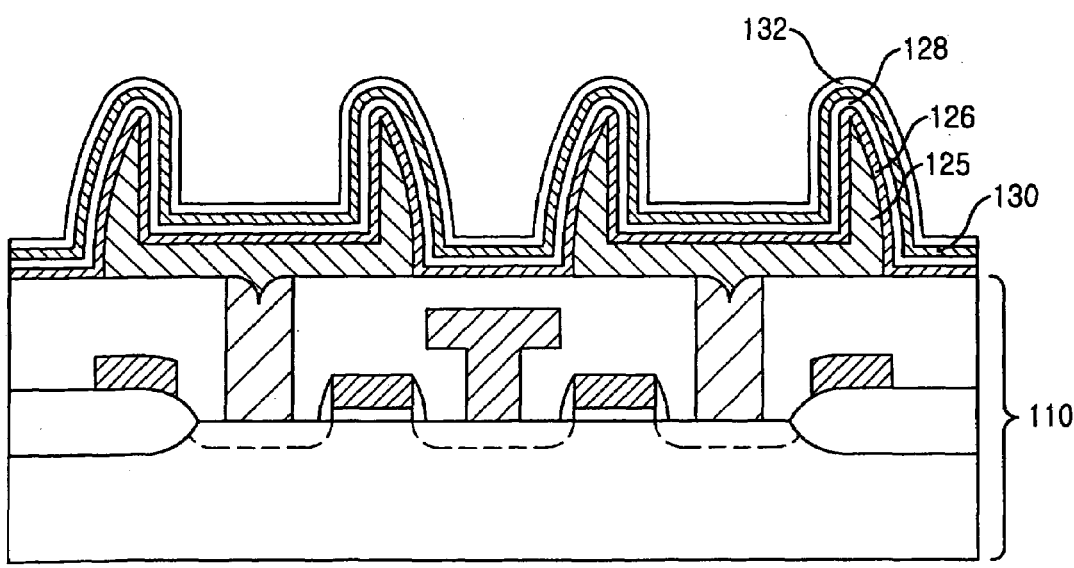

Thereafter, the second upper electrode layer 132 is formed on top of the first upper electrode layer 130, as shown in FIG. 2F. It is preferable that the second upper electrode layer 132 is made of a material selected from a group consisting of a poly-Si, W, WN, $Wsi_x$ and the like.

And then, the second upper electrode layer 132, the first upper electrode layer 130, the second dielectric layer 128 and the first dielectric layer 126 are patterned into a memory block.

Figure 2G:
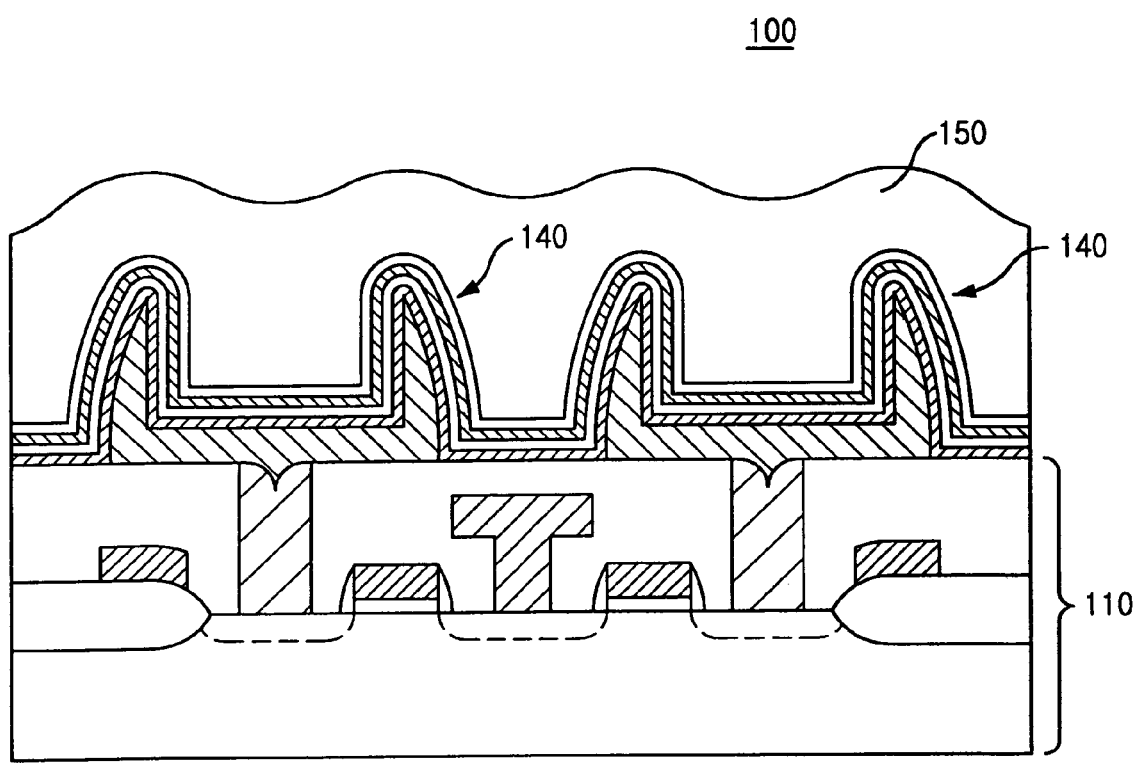

Finally, an insulating layer 150, e.g., made of BPSG, is formed on top of the capacitor structure 140 by using a method such as a plasma CVD and made flat by using a method such as chemical mechanical polishing (CMP), as shown in FIG. 2G.

By utilizing both $(Ta_2O_5)_x(TiO_2)_y$ and $Al_2O_3$ as a capacitor dielectric, the present invention can enhance a total dielectric constant of the capacitor dielectric with reducing a leakage current. Specifically, the total dielectric constant is increased by using $(Ta_2O_5)_x(TiO_2)_y$. And, $Al_2O_3$ prevent the upper electrode from reacting at an interface therebetween, thereby reducing the leakage current.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device for use in a memory cell, comprising the steps of:
   a) preparing an active matrix having at least one transistor, a plurality of conductive plugs electrically connected to the at least one transistor and an insulating layer laterally between adjacent conductive plugs;
   b) forming a conductive layer over each conductive plug to form a bottom electrode;
   c) forming a $(Ta_2O_5)_x(TiO_2)_y$ composite layer over the bottom electrodes, x and y representing a respective molar fraction;
   d) forming a dielectric layer over the $(Ta_2O_5)_x(TiO_2)_y$ composite layer; and
   e) patterning the dielectric layer and the $(Ta_2O_5)_x(TiO_2)_y$ composite layer into a preset configuration.

2. The method of claim 1, wherein the bottom electrode includes a material selected from a group consisting of a poly-Si, W, WN, $WSi_x$, TiN, Pt, Ru and Ir.

3. The method of claim 1, wherein the step of forming a $(Ta_2O_5)_x(TiO_2)_y$ composite layer includes the steps of:
   (1) alternately introducing first and second source gases into a reaction chamber, thereby forming a $Ta_2O_5$ thin layer;
   (2) alternately introducing third and fourth source gases into the reaction chamber, thereby forming a $TiO_2$ thin layer over the $Ta_2O_5$ thin layer;
   (3) repeating the steps (1) and (2), thereby obtaining stacked $Ta_2O_5$ and $TiO_2$ thin layers; and
   (4) heating the stacked thin layers at a temperature ranging from approximately 400° C. to approximately 550° C., thereby obtaining the $(Ta_2O_5)_x(TiO_2)_y$ composite layer.

4. The method of claim 3, wherein the first source gas includes a pentaethoxytantalum $(Ta(C_2H_5O)_5)$ gas, and the second source gas includes a gas selected from a group consisting of $H_2O$, $O_2$, $N_2O$ and alcohol $(C_xH_yOH)$ gases.

5. The method of claim 3, wherein the reaction chamber is kept at a temperature ranging from approximately 250° C. to approximately 350° C.

6. The method of claim 3, wherein a thickness of the $Ta_2O_5$ thin layer is less than or equal to 10 Å.

7. The method of claim 3, wherein the third source gas includes $TiCl_4$, and the fourth source gas includes a gas selected from a group consisting of $H_2O$, $O_2$ and $N_2O$ gases.

8. The method of claim 3, wherein a thickness of the $TiO_2$ thin layer is less than or equal to 5 Å.

9. The method of claim 3, wherein the $(Ta_2O_5)_x(TiO_2)_y$ composite layer has a thickness ranging from approximately 100 Å to approximately 200 Å.

10. The method of claim 3, wherein process cycles of steps (1) and (2) are controlled in such a way that x=0.92 and y=0.08.

11. The method of claim 3, further comprising introducing a first inert gas into the reaction chamber for 0.1–10 seconds to remove the first and second source gases which remain in the reaction chamber, after step (1).

12. The method of claim 11, further comprising introducing a second inert gas into the reaction chamber for 0.1–10 seconds to remove the third and fourth source gases and the first inert gas remaining in the reaction chamber, after step (2).

13. The method of claim 3, further comprising heat treating the $(Ta_2O_5)_x(TiO_2)_y$ composite layer and the dielectric layer in a furnace at a temperature ranging from approximately 600° C. to approximately 850° C. in the presence of $N_2O$.

14. The method of claim 3, further comprising forming a TiN layer over the dielectric layer.

15. The method of claim 3, wherein the first source gas includes tantalum chloride $(TaCl_5)$, and the second source gas includes a gas selected from a group consisting of $H_2O$, $O_2$, $N_2O$ and $C_xH_yOH$ gases.

16. A method for manufacturing a semiconductor device for use in a memory cell, comprising the steps of:
   preparing an active matrix having at least one transistor, a plurality of conductive plugs electrically connected to the at least one transistor and an insulating layer between each conductive plug;
   forming a conductive layer coupled to each conductive plug to form a first electrode;
   forming a $(Ta_2O_5)_x(TiO_2)_y$ composite layer adjacent to the first electrode, where x and each represent a respective molar fraction;
   forming a dielectric layer adjacent to the $(Ta_2O_5)_x(TiO_2)_y$ composite layer; and
   patterning the dielectric layer and the $(Ta_2O_5)_x(TiO_2)_y$ composite layer according to a preset configuration.

17. The method of claim 16, wherein the step of forming the $(Ta_2O_5)_x(TiO_2)_y$ composite layer includes the steps of:
   alternately introducing first and second source gases into a reaction chamber to form a $Ta_2O_5$ layer;
   alternately introducing third and fourth source gases into the reaction chamber to form a $TiO_2$ layer adjacent to the $Ta_2O_5$ layer; and
   heating the $TiO_2$ layer and the $Ta_2O_5$ layer from a temperature of approximately 400° C. to a temperature of approximately 550° C. to form the $(Ta_2O_5)_x(TiO_2)_y$ composite layer.

* * * * *